United States Patent
Wang et al.

(10) Patent No.: US 8,704,445 B2
(45) Date of Patent: Apr. 22, 2014

(54) METHOD FOR IMPROVING UNIFORMITY OF HIGH-FREQUENCY PLASMA DISCHARGE BY MEANS OF FREQUENCY MODULATION

(75) Inventors: Bo Wang, Beijing (CN); Lichun Xu, Beijing (CN); Ming Zhang, Beijing (CN); Ruzhi Wang, Beijing (CN); Xuemei Song, Beijing (CN); Yudong Hou, Beijing (CN); Mankang Zhu, Beijing (CN); Jingbing Liu, Beijing (CN); Hao Wang, Beijing (CN); Hui Yan, Beijing (CN)

(73) Assignee: Beijing University of Technology, Beijing (CN)

( * ) Notice: Subject to any disclaimer, the term of this patent is extended or adjusted under 35 U.S.C. 154(b) by 10 days.

(21) Appl. No.: 13/526,484

(22) Filed: Jun. 18, 2012

(65) Prior Publication Data

US 2013/0285551 A1  Oct. 31, 2013

(30) Foreign Application Priority Data

Apr. 28, 2012  (CN) .......................... 2012 1 0133070

(51) Int. Cl.
*H01J 7/24* (2006.01)

(52) U.S. Cl.
USPC ............ 315/111.41; 315/111.21; 315/111.31; 118/723 MW; 118/723 MP; 118/723 E; 438/723; 438/710; 438/485

(58) Field of Classification Search
USPC .............. 315/111.01, 111.41, 111.21, 111.31
See application file for complete search history.

(56) References Cited

U.S. PATENT DOCUMENTS

| | | | | |
|---|---|---|---|---|
| 5,449,412 A | * | 9/1995 | Pinneo | 118/723 MP |
| 5,534,070 A | * | 7/1996 | Okamura et al. | 118/723 E |
| 5,540,781 A | * | 7/1996 | Yamagami et al. | 118/723 E |
| 5,589,008 A | * | 12/1996 | Keppner | 136/259 |
| 6,009,828 A | * | 1/2000 | Tomita et al. | 118/723 E |
| 6,503,816 B2 | * | 1/2003 | Ito et al. | 438/485 |
| 6,518,195 B1 | * | 2/2003 | Collins et al. | 438/723 |
| 6,642,149 B2 | * | 11/2003 | Suemasa et al. | 438/710 |
| 8,040,068 B2 | * | 10/2011 | Coumou et al. | 315/111.21 |
| 8,312,839 B2 | * | 11/2012 | Baek | 118/723 MW |
| 2005/0093459 A1 | * | 5/2005 | Kishinevsky | 315/111.21 |

OTHER PUBLICATIONS

A. Hatta et al, Pulse modulated electron cyclotron reasonable plasma for chemical vapor deposition of diamond films Appl. Phys. Lett 66 1602 (1995).*

\* cited by examiner

*Primary Examiner* — Douglas W Owens
*Assistant Examiner* — Srinivas Sathiraju
(74) *Attorney, Agent, or Firm* — Han IP Corporation

(57) ABSTRACT

A method for improving the uniformity of high-frequency discharge plasma by means of frequency modulation is disclosed. In a plasma discharge chamber, there is a pair of parallel electrodes. A high-frequency power supply is adopted to feed the electrodes. The frequency range of the electromagnetic field is 13.56 MHz~160 MHz. Discharge gas is input to form plasma. The frequency of the fed-in high-frequency electromagnetic field is under automatic tuning control, and keeps changing cyclically without stop in the course of plasma discharge. The range of the frequency change may fall into either a portion of or the entire range of 13.56 MHz~160 MHz and makes the locations with higher plasma density on the plane in parallel with the electrodes and in the plasma discharge space changed cyclically. In a time slot longer than one frequency change cycle, the average plasma density between the parallel electrodes is uniform.

4 Claims, 2 Drawing Sheets

METHOD FOR IMPROVING UNIFORMITY OF HIGH-FREQUENCY PLASMA DISCHARGE BY MEANS OF FREQUENCY MODULATION

CROSS-REFERENCE TO RELATED APPLICATION

This application claims the priority benefit of Chinese Patent Application No. 201210133070.5, filed on Apr. 28, 2012, which is hereby incorporated by reference in its entirety.

TECHNICAL FIELD

The present invention pertains to the technical field of high-frequency discharge plasma, relates to a method for improving the uniformity of high-frequency discharge plasma by means of frequency modulation (FM), and is applied in the field of very high frequency (VHF) discharge plasma vapor deposition and surface treatment.

BACKGROUND

The RF-PECVD (radio frequency-plasma enhanced chemical vapor deposition) technology is widely used in the mass industrial production of large-area silicon film photovoltaic solar cells. In order to raise the conversion efficiency of solar cells, nano-crystalline silicon films where nano-crystalline grains are distributed in amorphous silicon are adopted in most cases. However, RF-PECVD technology features low efficiency in deposition of nano-crystalline silicon and low crystallinity. There has been developed the VHF-PECVD (very high frequency—plasma enhanced chemical vapor deposition) method. VHF-PECVD method helps raise the deposition velocity and quality of nano-crystalline silicon films. Exciting plasma by VHF can raise plasma density and reduce the sheath thickness and voltage of substrate surface, thus reducing the ion energy reaching the substrate, increasing the ion flow delivered to the substrate and achieving the double effects of raising deposition velocity and crystallization ratio of the films. Therefore, VHF-PECVD has tremendous potential of technical development in the industry.

In the plasma excited by a VHF electromagnetic field, there is an inherent problem: the increase of the excitation frequency of the electromagnetic field will make the uniformity poorer. Particularly, when one quarter of the vacuum wavelength to which the excitation frequency corresponds is approximate to the scale of the electrodes, the non-uniformity generated by the standing wave effect in the capacity-coupled electrode reaction chamber will be rather serious. Therefore, the potential standing wave effect is considered the most important non-conformity source generated during application of VHF technology in large-area PECVD. In order to obtain uniform plasma and thereby realize uniform deposition, typically the geometric shape of the electrodes is redesigned to improve the distribution of the electric field. Further, multi-point feeding, phase control, superposition of a plurality of power sources, pulse modulation of power sources and other methods may also improve plasma uniformity to some extent.

SUMMARY

The object of the present invention is to solve the problem of poor uniformity of high-frequency discharge in the prior art, particularly the VHF discharge plasma, and provide a method for improving plasma uniformity by means of constantly changing the frequency of the high-frequency electromagnetic field (i.e.: FM). Different from other methods, the present invention improves plasma uniformity by means of constantly changing the frequency of the high-frequency discharge electromagnetic field.

To realize the above object, the present invention employs the following principle: According to the physical principle of waves, standing wave is a special phenomenon formed by superposition of two coherent waves of same amplitude, frequency and propagation velocity propagated in reverse directions. When the transmission and reflex distance is integral multiples of half wavelength, standing wave is generated. The distance between antinodes is a half wavelength. The distance between antinodes and nodes is one quarter of wavelength. Therefore, the constant and cyclical change of VHF at an appropriate velocity may make the two waves propagated in reverse directions have different wavelengths all the time, thereby suppressing or eliminating the formation of standing wave. On the other hand, different frequency ranges of a high-frequency electromagnetic field may generate different plasma density distributions. When the frequency is approximate to 13.56 MHz (RF range), the plasma density in the vicinity of the electrode fringe is relatively high. When the frequency is approximate to 60 MHz (VHF range), the plasma density in the vicinity of the electrode center is relatively high. While when VHF is approximate to or higher than 100 MHz, again the plasma density in the vicinity of the electrode fringe is relatively high. Therefore, if the solution of the present invention: constant and cyclical change of the frequency of the electromagnetic field, is adopted, then even if the velocity of frequency change is not high enough to eliminate VHF standing wave, the uniformity of average plasma density at every location may still be realized in a period longer than the frequency change cycle due to the constant change of the locations with the highest plasma density.

The present invention provides a method for improving high-frequency discharge plasma uniformity by means of FM. In a plasma discharge chamber, there is a pair of parallel electrodes. The space between the parallel electrodes is a plasma discharge space. A high-frequency power supply is adopted to feed the electrodes and generate a high-frequency electromagnetic field between the parallel electrodes. The frequency range of the electromagnetic field is 13.56 MHz~160 MHz. When discharge gas is input into the space between the parallel electrodes, ionization occurs under the action of the high-frequency electromagnetic field and plasma is formed, characterized in that the frequency of the fed high-frequency electromagnetic field has experienced automatic tuning control, and keeps changing cyclically without stop in the course of plasma discharge. The automatic tuning control includes without limitation the automatic control based on the tuning signals internally set by the high-frequency power supply and the tuning signals from outside the power supply. The range of the frequency change may fall either a part of 13.56 MHz~160 MHz or the whole range of 13.56 MHz~160 MHz and makes the locations with higher plasma density on the plane in parallel with the electrodes and in the plasma discharge space changed cyclically. The mode of the cyclical frequency change may be a constant cycle, or a non-constant cycle. The range of the cycle of the cyclical frequency change is within the range of 10 ns~24 h.

The types of the electrodes in terms of shape include without limitation: planar electrodes, curved surface electrodes and stepped electrodes. One of the parallel electrodes may be grounded. Alternatively, neither of them is grounded, i.e.: the two electrodes are both in a suspended state relative to the ground. The high-frequency power supply may be a single power source or the superposition of a plurality of power sources. The power source may or may not adopt pulse modulation. The high-frequency power supply may be fed into the electrodes from a single point or a plurality of points.

According to the method provided by the present invention, the uniformity of the average plasma density on a plane between the parallel electrodes can be realized in a period longer than the frequency circulation cycle of the electromagnetic field. In other words, in a time slot longer than one frequency change cycle, the average plasma density between the parallel electrodes is uniform.

In the figures: 1. Plasma discharge chamber; 2. Parallel electrode; 3. High-frequency power supply.

DETAILED DESCRIPTION OF SAMPLE EMBODIMENTS

Below the present invention is explained in connection with embodiments though not limited to the embodiments.

First Embodiment

Figure 1:
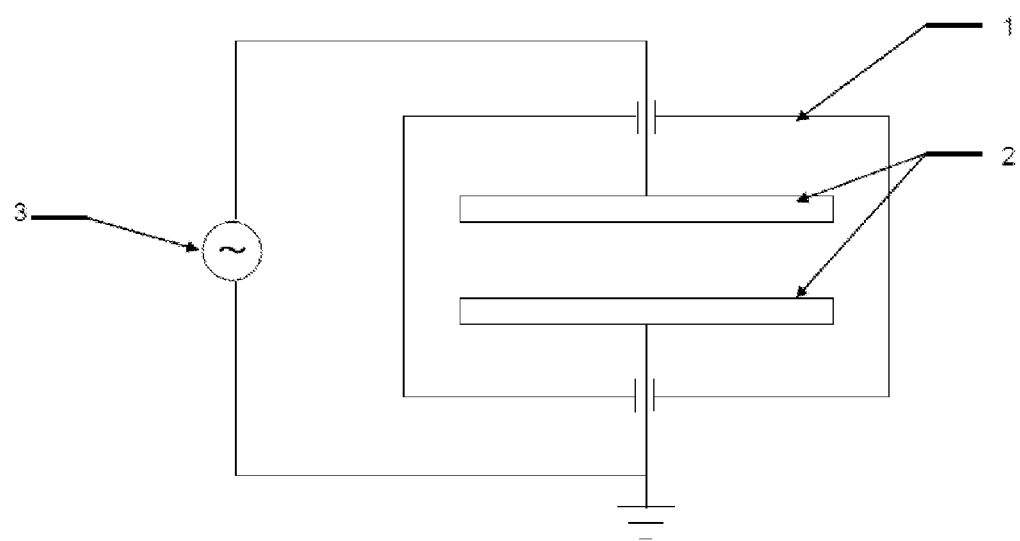
FIG. 1 is a schematic diagram of the present invention, with one electrode grounded.

In a plasma discharge chamber 1, there is a pair of parallel electrodes 2, with the lower electrode grounded (refer to FIG. 1). Discharge gas Ar is input into the plasma discharge chamber 1. Then a high-frequency power supply 3 applies a high-frequency electromagnetic field between the two parallel electrodes 2 to generate plasma discharge. In the applied high-frequency electromagnetic field, the tuning signals internally set by the high-frequency power supply tune frequency to make the output frequency cyclically changed within the range of 13.56 MHz~60 MHz at a cycle of 24 h. The plasma generated by discharge of this parameter is used for erosion treatment of a silicon surface. The silicon wafer is placed on the lower electrode. The treatment takes 72 h. The treated sample surface is measured. Its non-conformity is 0.5%, suggesting desirable uniformity.

Second Embodiment

Figure 2:
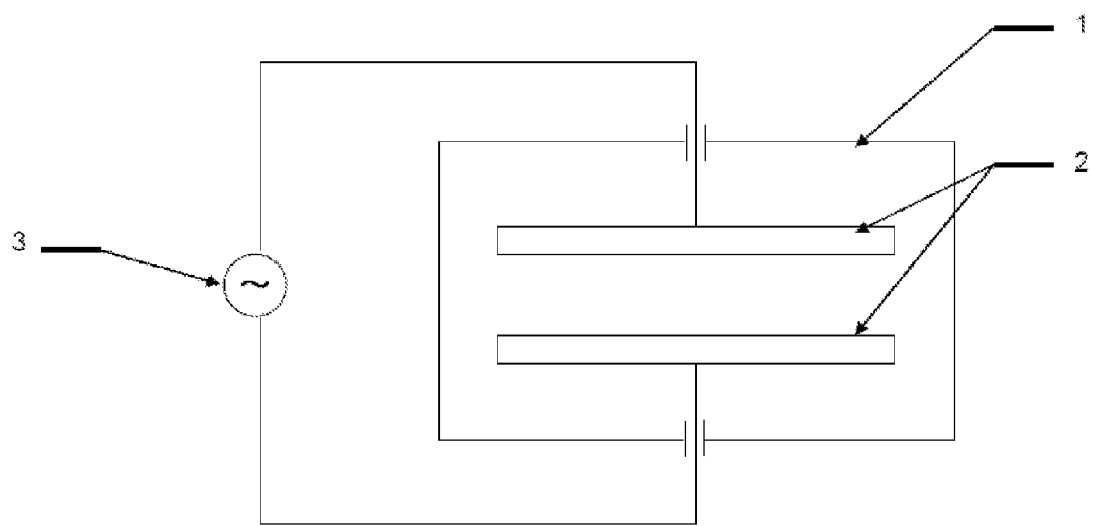
FIG. 2 is a schematic diagram of the present invention, with neither electrode grounded.

In a plasma discharge chamber 1, there is a pair of parallel electrodes 2, with neither electrode grounded (refer to FIG. 2). Discharge gas silane is input into the plasma discharge chamber 1. Then a high-frequency power supply 3 applies a high-frequency electromagnetic field between the two parallel electrodes 2 to generate plasma discharge. In the applied high-frequency electromagnetic field, the tuning signals internally set by the high-frequency power supply tune frequency to make the output frequency cyclically changed within the range of 60 MHz~160 MHz at a cycle of 10 ns. This parameter is used to make silane discharge electricity, form plasma and be decomposed to generate a silicon deposition effect. A substrate is placed between the two electrodes. The deposition takes 0.5 h. The thickness of the silicon film on the sample surface after deposition is measured. Its non-conformity is 0.2%, suggesting desirable uniformity.

Third Embodiment

In a plasma discharge chamber 1, there is a pair of parallel electrodes 2, with the lower electrode grounded (refer to FIG. 1). Discharge gas oxygen is input into the plasma discharge chamber 1. Then a high-frequency power supply 3 applies a high-frequency electromagnetic field between the two parallel electrodes 2 to generate plasma discharge. In the applied high-frequency electromagnetic field, the tuning signals internally set by the high-frequency power supply tune frequency to make the output frequency cyclically changed within the range of 13.56 MHz~60 MHz at a cycle of 0.5 h. The plasma generated by discharge of this parameter is used for chemical erosion treatment of an organic surface. The substrate coated with an organic resist film is placed on the lower electrode. The treatment takes 0.5 h. The treated sample surface is measured. Its non-conformity is 1%, suggesting desirable uniformity.

What is claimed is:

1. A method for improving high-frequency discharge plasma uniformity by means of frequency modulation, the method comprising:
    generating a high-frequency electromagnetic field between a pair of parallel electrodes that are in a plasma discharge chamber by feeding a high-frequency power supply to the parallel electrodes, a space between the parallel electrodes being a plasma discharge space, a frequency of the high-frequency electromagnetic field being in a range between 13.56MHz and 160MHz;
    providing a discharge gas to the plasma discharge space between the parallel electrodes so that the discharge gas is ionized under the high-frequency electromagnetic field to form plasma and cause plasma discharge; and
    cyclically changing the frequency of the high-frequency electromagnetic field within a portion or an entirety of the range between 13.56MHz and 160MHz without stopping during the plasma discharge such that locations of relatively higher plasma density in the plasma discharge space change cyclically.

2. A method according to claim 1, wherein the frequency of the high-frequency electromagnetic field is under automatic tuning control based on tuning signals internally set by the high-frequency power supply or tuning signals from outside the power supply.

3. A method according to claim 1, wherein the frequency of the high-frequency electromagnetic field change according to a constant cycle or a non-constant cycle.

4. A method according to claim 3, wherein a range of the cycle of the cyclical frequency change is within a range between 10 nanoseconds and 24 hours.

* * * * *